(12) United States Patent
Lander

(10) Patent No.: US 8,390,387 B2
(45) Date of Patent: Mar. 5, 2013

(54) MEMS RESONATORS

(75) Inventor: Robert James Pascoe Lander, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/156,485

(22) Filed: Jun. 9, 2011

(65) Prior Publication Data

US 2011/0304405 A1    Dec. 15, 2011

(30) Foreign Application Priority Data

Jun. 10, 2010   (EP) .................................... 10165496

(51) Int. Cl.
*H01L 41/00*   (2006.01)
*H03B 5/30*    (2006.01)

(52) U.S. Cl. ........................... 331/154; 331/56; 310/321

(58) Field of Classification Search .................. 331/154, 331/162, 56; 310/321; 333/197, 200
See application file for complete search history.

(56) References Cited

U.S. PATENT DOCUMENTS

| | | | |
|---|---|---|---|
| 2007/0024158 A1 | 2/2007 | Bourgeois | |
| 2007/0247245 A1 | 10/2007 | Hagelin | |
| 2010/0277262 A1* | 11/2010 | Phan Le et al. | ............... 333/219 |

FOREIGN PATENT DOCUMENTS

| | | |
|---|---|---|
| EP | 2 302 792 A1 | 3/2011 |
| WO | 2009/123716 A1 | 10/2009 |

OTHER PUBLICATIONS

Koskenvuori, M. et al. "Temperature Measurement and Compensation Based on Two Vibrating Modes of a Bulk Acoustic Mode Microresonator", IEEE $21^{st}$ Int'l. Conf. on MEMS, pp. 78-81 (Feb. 2008).
Salvia, J. et al. "Phase Lock Loop Based Temperature Compensation for MEMS Oscillators", IEEE $22^{nd}$ Int'l. Conf. on MEMS, pp. 661-664 (Jan. 2009).
Extended European Search Report for European Patent Appln. No. 10165496.0 (Nov. 5, 2010).

* cited by examiner

*Primary Examiner* — Joseph Chang

(57) ABSTRACT

A crystalline semiconductor resonator device comprises two matched resonators which are aligned differently with respect to the crystal structure of the crystalline semiconductor. The resonators each comprise a portion of a material having a different temperature dependency of the Young's modulus to the temperature dependency of the Young's modulus of the crystalline semiconductor material. In this way, the suspension springs for the resonators have different properties, which influence the resonant frequency. The resonant frequency ratios between the first and second resonators at a calibration temperature and an operation temperature are measured. A frequency of one (or both) of the resonators at the operation temperature can then be derived which takes into account the temperature dependency of the one of the resonators.

20 Claims, 8 Drawing Sheets

MEMS RESONATORS

This application claims the priority under 35 U.S.C. §119 of European patent application no. 10165496.0, filed on Jun. 10, 2010, the contents of which are incorporated by reference herein.

FIELD OF THE INVENTION

This invention relates to MEMS resonators.

BACKGROUND OF THE INVENTION

MEMS resonator structures offer an attractive alternative to quartz resonators as frequency references for many applications because of their lower cost and reduced form factor.

Temperature and process variations impact the oscillation frequency of Silicon MEMS resonators beyond the tolerance limits of many applications. MEMS resonators are for example used in reference oscillators in RF receiver circuits. The resonance frequency of a MEMS resonator in silicon exhibits a temperature drift of typically −30 ppm/K. For some applications this drift needs to be reduced significantly. For example, when using a MEMS resonator in a GSM reference oscillator the drift needs to be below +/−20 ppm or even +/−10 ppm over a temperature range of 100K.

The main cause of the temperature dependence of the resonance frequency is the negative temperature coefficient of the elastic modulus exhibited by all but a few materials. This results in a reduced spring constant at higher temperatures, and hence a reduced frequency.

Several solutions have been proposed to correct for the temperature dependence:

Active temperature compensation techniques involve keeping the resonator at a constant temperature by placing the resonator in a temperature controlled feedback loop. In this case, the temperature is measured on, or in close vicinity of the resonator. This temperature is then stabilized by heating the resonator to a preset temperature. This approach is limited by the accuracy of the temperature measurement used to determine the required correction factor.

Passive temperature compensation techniques involve designing the resonator to reduce the dependency of the frequency on temperature. One approach is to combine monocrystalline silicon with amorphous SiO2, since the Young's modulus of SiO2 exhibits an opposite temperature dependency to that of silicon. More generally, this approach involves deposition/growth of layers with positive temperature coefficient of the elastic modulus to reduce the resulting error, but these approaches are sensitive to small variations in the thickness of the deposited layer.

There is therefore a need for a simple and easily detectable technique that eliminates sensitivity to all non-local process variations and determines the correction factor due to temperature changes to very high accuracy.

SUMMARY OF THE INVENTION

According to the invention, there is provided a crystalline semiconductor resonator device comprising:

a first resonator having an elongate spring member which comprises a first portion of the crystalline semiconductor, for supporting a semiconductor resonator mass of the first resonator;

a second resonator having an elongate spring member which comprises a second portion of the crystalline semiconductor for supporting a resonator mass of the second resonator, wherein the elongate spring members are aligned with respect to the crystal structure of the crystalline semiconductor such that the Young's moduli are different, wherein the elongate spring members of the first and second resonators each comprise a portion of a material having a different temperature dependency of the Young's modulus to the temperature dependency of the Young's modulus of the crystalline semiconductor material; and measurement means for measuring the resonant frequency ratio between the first and second resonators at a calibration temperature and an operation temperature and for deriving therefrom a frequency of one of the resonators at the operation temperature which takes into account the temperature dependency of the one of the resonators.

This invention is based on the recognition that the ratio of the resonant frequencies of two resonators with components of different materials with different Young's modulus, and with different axes of oscillation (e.g. <100> vs. <110>) can be closely correlated with the respective temperature coefficients of the resonant frequencies (for the case that any variations in frequency are due to non-local process fluctuations). Thus, a single frequency comparison during calibration phase can be used to determine the temperature dependence of the resonant frequency of both resonators. Further, a single frequency comparison during operation phase can be used to accurately determine the resonator frequency and thus provide a temperature-independent frequency reference. This avoids the need for temperature measurement in order to derive a temperature compensation.

Each resonator can comprise a resonator mass portion and an elongate spring portion connected to the resonator mass portion. There can be opposite resonator masses connected by the spring portion to define what is sometimes referred to as a dogbone configuration.

The first resonator spring member can be aligned with the <100> crystal direction and the second resonator spring member can be aligned with the <110> crystal direction.

The first and second resonators are preferably side by side and formed from the same layers. This means the temperature dependency of frequency is affected by process variations as little as possible.

Each resonator preferably comprises a semiconductor core and an oxide coating. The oxide coating influences the temperature dependency of the frequency, and the thickness of the oxide coating can be tuned in such a way as to optimise the accuracy of the frequency compensation. Each resonator preferably comprises a silicon core and a silicon oxide coating.

The invention also provides a method of operating a crystalline semiconductor resonator, comprising:

measuring the resonant frequency ratio between first and second resonators at a calibration temperature, each resonator comprising an elongate spring member with the elongate spring members aligned differently with respect to the crystal structure of the crystalline semiconductor such that the Young's moduli are different, and the elongate spring members of the first and second resonators each comprising a portion of a material having a different temperature dependency of the Young's modulus to the temperature dependency of the Young's modulus of the crystalline semiconductor;

measuring the resonant frequency ratio between first and second resonators at an operation temperature; and deriving from the frequency ratio a frequency of one of the resonators at the operation temperature which takes into account the temperature dependency of the one of the resonators.

BRIEF DESCRIPTION OF THE DRAWINGS

Examples of the invention will now be described in detail with reference to the accompanying drawings, in which.

DETAILED DESCRIPTION OF EMBODIMENTS

The invention provides a crystalline semiconductor resonator device comprising two identical resonators which are aligned differently with respect to the crystal structure of the crystalline semiconductor. In this way, the suspension springs for the resonators have different properties, which influence the resonant frequency. The resonant frequency ratios between the first and second resonators at a calibration temperature and an operation temperature are measured. A frequency of one (or both) of the resonators at the operation temperature can then be derived which takes into account the temperature dependency of the one of the resonators.

The resonance frequency of a simple Si MEMS resonator varies by −30 ppm/K due to the temperature dependence of the Young's modulus. This shift can be corrected in the control circuitry if the temperature of the resonator springs is known. Accuracy of this temperature measurement is typically limited to around 5° C. This error derives from the inaccuracy of the temperature sensors that can be integrated in the package, and from the power dissipation in the springs (particularly for piezoresistive readout) combined with the large thermal resistance connecting the springs to the temperature sensor.

Passive temperature compensation techniques, involving deposition/growth of layers with positive temperature coefficient of the elastic modulus (e.g. oxides such as SiO2) can reduce the resulting error but are sensitive to small variations in the thickness of the deposited layer.

Figure 1:
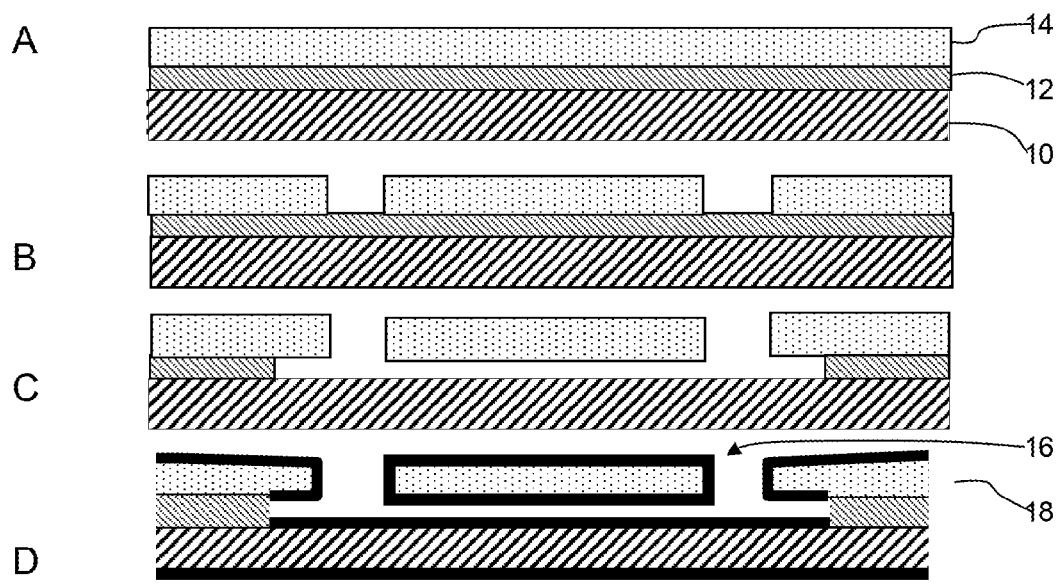
FIG. 1 shows a known process for forming a resonator on a Silicon-on-Insulator wafer.
Figure 1:
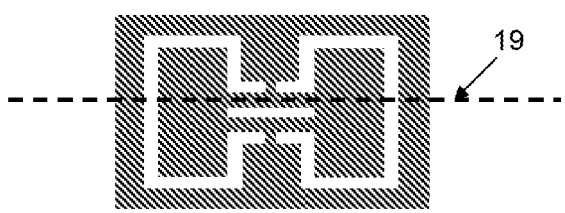

As shown in FIG. 1, the process starts with a Silicon-on-Insulator (SOI) wafer, comprising a monocrystalline silicon substrate 10, $SiO_2$ layer 12 and silicon layer 14 as shown in FIG. 1A. The top silicon layer is then patterned as shown in FIG. 1B, followed by an isotropic sacrificial layer etch of the $SiO_2$ layer as shown in FIG. 1C. During the last step the freestanding Si beam 16 element is oxidized in a furnace to provide an oxidised surface layer 18 as shown in FIG. 1D.

After the silicon resonator has been released from the substrate, the exposed parts of the Si surface are covered with a layer of $SiO_2$ by this oxidation process. In order to have perfect temperature compensation, the layer thickness of the Si and $SiO_2$ layers needs to be matched to a high degree.

FIG. 1 shows a resonator shape which is referred to as a dogbone, in plan view and the horizontal line 19 shows where the cross sections above are taken. The invention relates more generally to resonator configurations having length extensional spring portion, so that the spring constant is determined by length extension/compression.

The frequency error is estimated for various compensated geometries (varying the $SiO_2$/Si fraction β in the springs).

The springs comprise an elongate bar. Taking a cross section perpendicular to the bar length, the amount of oxidation determines the thickness of the oxide coating. In cross section, there is a central silicon area and a peripheral oxide layer. The parameter β is defined as the $SiO_2$/Si cross-sectional area ratio in the resonator springs when viewed in this perpendicular cross section.

Figure 2:
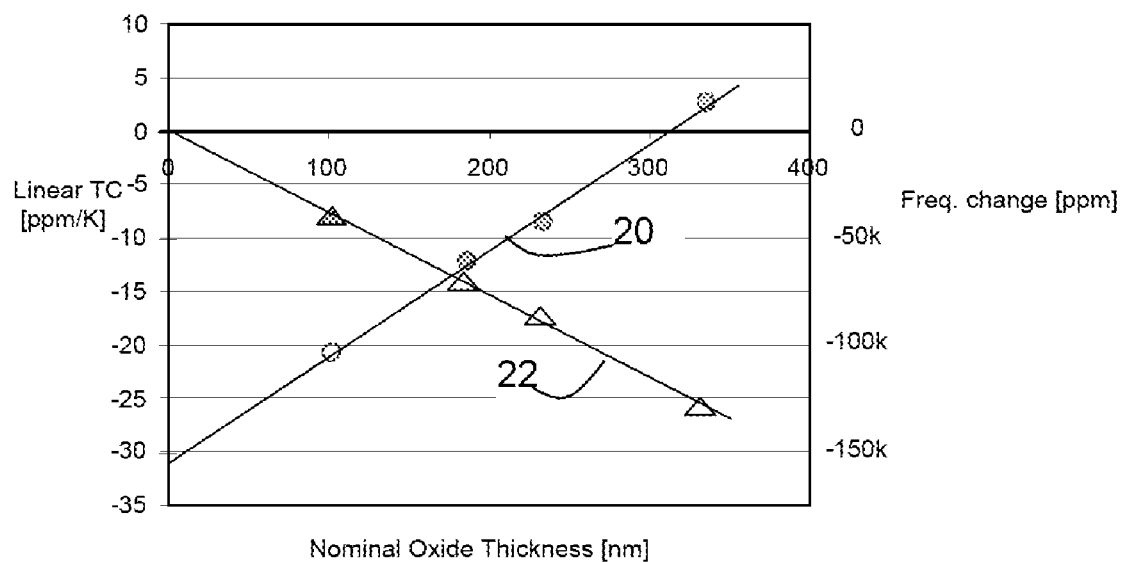
FIG. 2 shows the linear temperature coefficient of the resonant frequency and resonance frequency for different oxide thicknesses.

FIG. 2 shows as plot 20 the linear temperature coefficients (in ppm/K) extrapolated from four layer thicknesses of silicon dioxide, and as plot 22 the change in resonance frequency (in ppm) extrapolated from the same four samples.

It can be seen in FIG. 2 that the temperature coefficient of the resonant frequency can be reduced with increased oxidation (i.e. greater oxide thickness).

Figure 3:
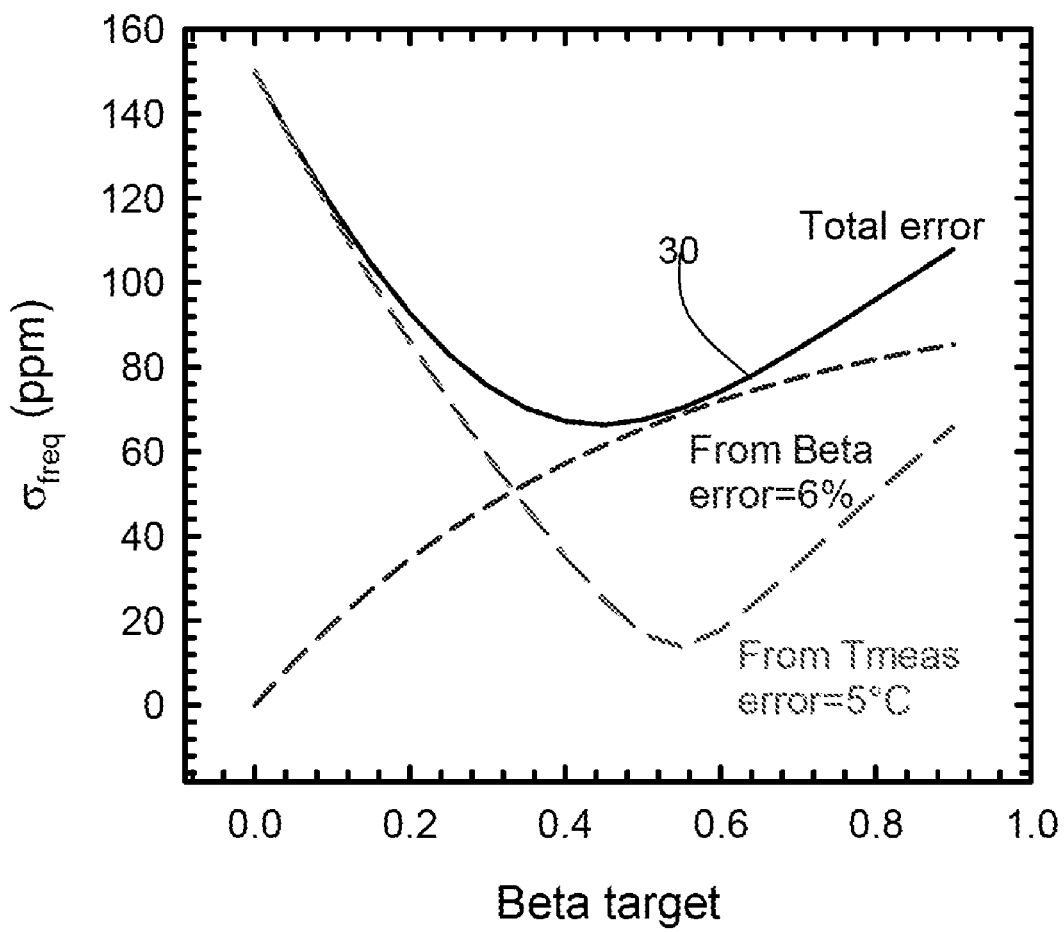
FIG. 3 shows the uncertainty in the resonance frequency resulting from uncertainties in the temperature coefficient (due to geometric variations) and temperature measurement errors during operation.

The frequency error is reduced compared to a pure Si resonator (beta=0) but by no more than a factor of 2. FIG. 3 shows the frequency error resulting from temperature measurement errors during operation. FIG. 3 also shows the effect of β variations. A max β variation of 6% and temperature measurement error of 5° C. is assumed. FIG. 3 shows that the known frequency error reduction gives 20-1500 ppm error.

There are two main sources of uncertainty in the frequency correction factor: (i) the operating temperature and (ii) the temperature coefficient of the springs (determined by uncertainty in the value of beta). For beta=0 there is no uncertainty in the temperature coefficient as it is a known material property of pure Si. For beta ~0.5, the temperature has least impact on the frequency correction factor because here the frequency depends only weakly on temperature. These two contributions to the uncertainty are shown as the dotted curves in FIG. 3.

Thus, there is an optimum value of beta that is determined by (i) the uncertainty in the temperature measurement and (ii) the uncertainty in beta. This optimum is indicated by the minimum in the solid plot 30, in the case where the uncertainty in beta corresponds to the total variation in beta. This assumption is true if a single calibration temperature is used. If calibration is at two temperatures then the temperature coefficient can be measured directly, and thus the uncertainty in the value of beta becomes smaller. The total error (plot 30) in FIG. 3 is valid for a frequency calibration at one temperature.

The multiple temperature frequency calibration approach mentioned above can further reduce the frequency error to the "$T_{meas}$" limit (~20 ppm for beta~0.5), by eliminating the uncertainty in beta ratio, but this approach is undesirable from a cost point-of-view due to the long calibration time.

A combination of two resonators which have different temperature coefficients of the resonant frequency offers an accurate means to determine the temperature, however, achieving a different temperature coefficient requires either a different material composition in the springs or a very different mode of oscillation. Achieving a different material composition in the springs greatly complicates the process and will compromise the temperature measurement accuracy because the thermal resistance of the two resonators will be different. Inducing two very different modes of oscillation has been demonstrated in the article *Temperature measurement and compensation based on two vibrating modes* by Koskenvuori et al, MEMS 2008 Conference, Jan. 13-17, 2008. This approach imposes severe constraints upon the device design, performance and operation conditions.

Embodiments of the invention achieve different temperature coefficients of resonant frequency by combining partial oxidation with different Si resonator crystal orientations.

Figure 4:
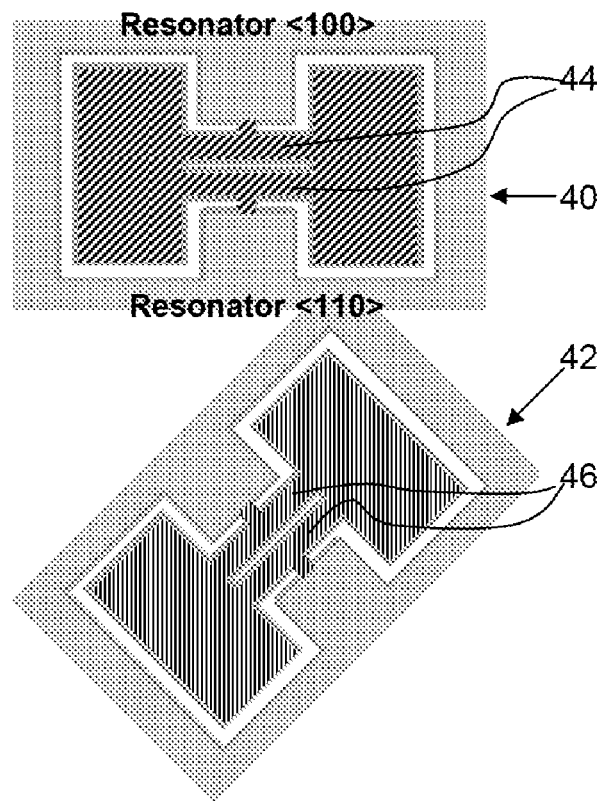
FIG. 4 shows a device of the invention.

This is illustrated in FIG. 4.

This shows two resonators 40,42, identical except that one 40 has springs 44 oriented along the <100> direction and the other has springs 46 along the <110> direction. The two resonators are sufficiently close that the process variations that impact the resonant frequency (e.g. etch, oxide thickness, SOI thickness) are strongly correlated between the two. Such local correlation has been proven for lithography & etch variations and is also true for both oxide thickness and SOI thickness variations.

Figure 5:
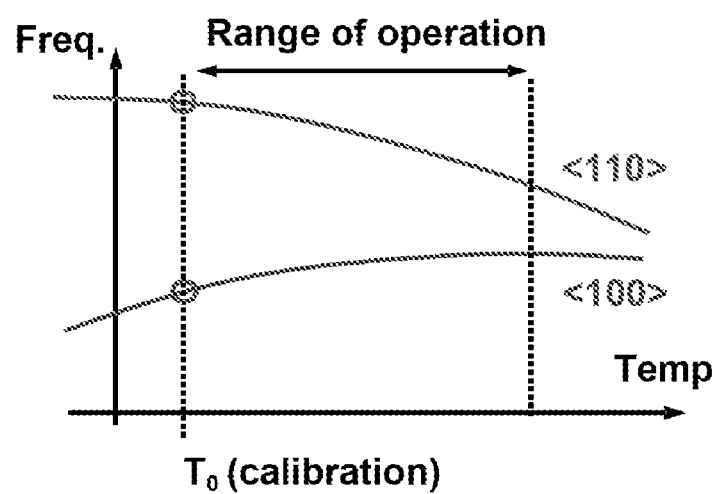
FIG. 5 shows the frequency dependence upon temperature of Si/SiO2 MEMS resonators with the two different orientations.

FIG. 5 shows the frequency dependence upon temperature of Si/SiO2 MEMS resonators with the two different orientations. The key requirement is that the frequency evolves differently with temperature for the two resonator orientations, so that the ratio between the frequencies varies with temperature. As will become apparent from the discussion below, this variation in frequency function can be achieved for resonators with an oxide coating and with different orientations.

The resonant frequency f varies with the spring constant k and mass m as follows:

$$f = \frac{1}{2\pi}\sqrt{\frac{k}{m}}. \quad (1)$$

k is the spring constant and m is the resonator mass.

In the following equations, $A_{Si}$ and $A_{SiO2}$ are the cross-sectional areas of Si and $SiO_2$ in the springs (from the which the ratio $\beta$ is derived as $\beta \equiv A_{SiO2}/A_{Si}$), $E_{Si,SiO2}$ are the respective Young's moduli and $\alpha_{Si,SiO2}$ are the respective temperature coefficients of Young's modulus. The Young's moduli for silicon are different depending on the orientation, hence different values $E_{Si<100>}$ and $E_{Si<110>}$.

For given materials, the ratio $\beta$ is the only variable parameter. This means that $\beta$ determines the temperature coefficient of the spring constant.

If local variations are small then the masses of the two resonators will be identical and ratio of the spring constants can be expressed as follows:

$$k_{<100>}/k_{<110>} = \frac{E_{Si<100>} + \beta E_{SiO2}}{E_{Si<110>} + \beta E_{SiO2}}. \quad (2)$$

For a spring of one material the spring constant is given by k=E*W*H/L (where W, H and L are the spring width, height and length respectively).

For a composite spring (equivalent to two springs of equal length in parallel) the spring constant is given by:

$$k=(E_1*W_1*H_1/L_{1=2})+(E_2*W_2*H_2/L_{1=2}) \quad (2.1)$$

By taking two different springs with $E_1=E_{100}$ and $E_{110}$ respectively but the same value of $E_2=E_{SiO2}$, equation 2 is derived from equation 2.1.

Thus, the ratio of the resonant frequencies (each of which depends on k as shown in Equation 1) is uniquely defined by the ratio $\beta$. This assumes that the temperatures of the resonators are identical, but since the geometries are identical, the thermal dissipation and thermal resistances are also closely matched. Thus, the temperature coefficient of the spring constant can be determined from the ratio of the frequencies of the two oscillators. This then enables accurate temperature compensation.

The relevant relationships will now be derived.

Equation (2) can be rewritten as:

$$\beta = \frac{\frac{k_{<100>}}{k_{<110>}}E_{Si<110>} - E_{Si<100>}}{E_{SiO2}\left(1 - \frac{k_{<100>}}{k_{<110>}}\right)} \quad (3)$$

Figure 6:
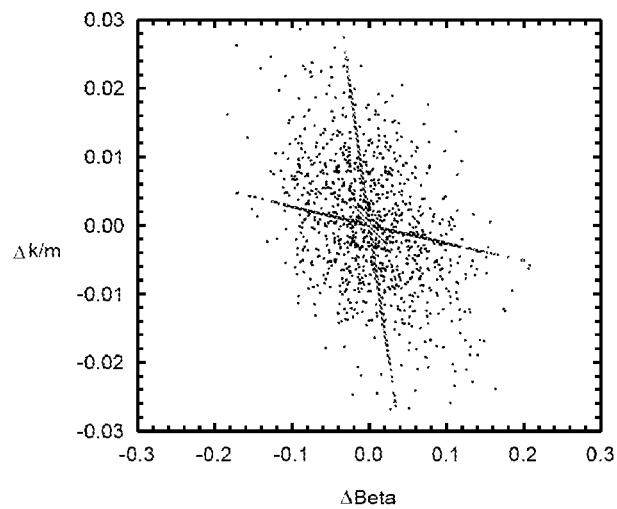
FIG. 6 shows a simulation of frequency vs. oxide thickness ratio for a first orientation of device.
Figure 7:
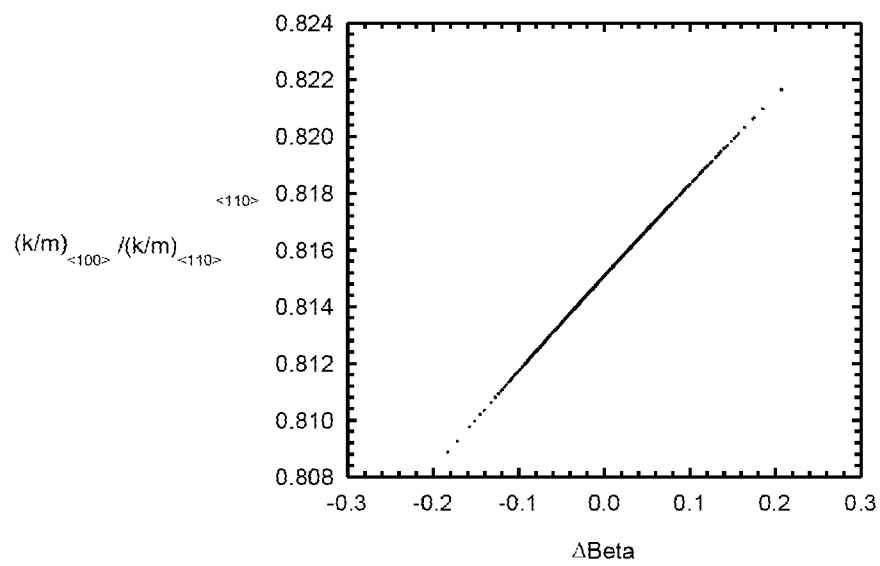
FIG. 7 plots the ratio of frequency squared for the two orientations of device vs. oxide thickness ratio.

This is illustrated in FIG. 6 and FIG. 7. FIG. 6 shows a Monte Carlo simulation of spring constant variation vs. $\beta$ ratio variation for a <100> oriented device. Because there are multiple variables (etch dimension "CD", oxide thickness ($t_{ox}$), and silicon-on-insulator thickness ($T_{SOI}$) there is only weak correlation between the frequency of the resonator and the $\beta$ ratio.

FIG. 7 plots the ratio $(k_{<100>}/m)/(k_{<110>}/m)$ (which is proportional to $(f_{<100>}/f_{<110>})^2$) for the same sample distribution. It can be seen that there is a linear relationship between the frequency ratios of a pair of <100>/<110> devices and beta ratio.

The correction factor to be applied to the frequency generated by the <100> oriented resonator during operation is $$\frac{k_{<100>}(T)}{k_{<100>}(T_0)} = (T - T_0)\tau_{c,<100>} + 1, \quad (4)$$

where $\tau_{c<100>}$ is the temperature coefficient of the <100>-oriented Si/SiO$_2$ composite spring. Equation 4 assumes linear deviation of the spring constant with temperature from the calibration temperature $T_0$.

This can be expressed as follows:

$$\tau_{c,<100>} = \frac{E_{Si<100>}(T_0)\alpha_{Si}(T, T_0) + \beta E_{SiO2}(T_0)\alpha_{SiO2}(T, T_0)}{E_{Si<100>}(T_0) + \beta E_{SiO2}(T_0)}, \quad (5)$$

where $\alpha_{Si}(T,T_0)$, $\alpha_{SiO2}(T,T_0)$ are the average temperature coefficients of the elastic constants of Si (this is effectively orientation independent) and SiO$_2$ respectively over the range $T_0 \rightarrow T$ (in ppm/K).

Note that the same equation applies to the value of $\tau_{c,<110>}$ with substitution of the <110> parameters into the equation.

Substituting for β we obtain:

$$\tau_{c,<100>} = \frac{\alpha_{Si}(T, T_0)\left(\frac{k_{Si<110>}}{k_{Si<100>}} - 1\right) + \alpha_{SiO2}(T, T_0)\left(\frac{E_{Si<110>}(T_0)}{E_{Si<100>}(T_0)} - \frac{k_{Si<110>}}{k_{Si<100>}}\right)}{\left(\frac{E_{Si<110>}(T_0)}{E_{Si<100>}(T_0)} - 1\right)} \quad (6)$$

The spring constant ratio (equal to the ratio of $f^2$) at operation temperature can be expressed as:

$$\frac{k_{<100>}(T)}{k_{<110>}(T)} = \frac{k_{<100>}(T_0)}{k_{<110>}(T_0)}\left(\frac{(T-T_0)\tau_{c,<100>} + 1}{(T-T_0)\tau_{c,<110>} + 1}\right). \quad (7)$$

Rearranging this we obtain an expression for $(T-T_0)$ that can be substituted into Equation 4 yielding the following relation:

$$\frac{k_{<100>}(T)}{k_{<100>}(T_0)} = \frac{\left(\frac{\tau_{c,<110>}}{\tau_{c,<100>}} - 1\right)}{\left(\frac{\tau_{c,<110>}}{\tau_{c,<100>}}\right) - \left(\frac{k_{<100>}(T_0)}{k_{<110>}(T_0)}\frac{k_{<110>}(T)}{k_{<100>}(T)}\right)}, \quad (8)$$

Figure 9:
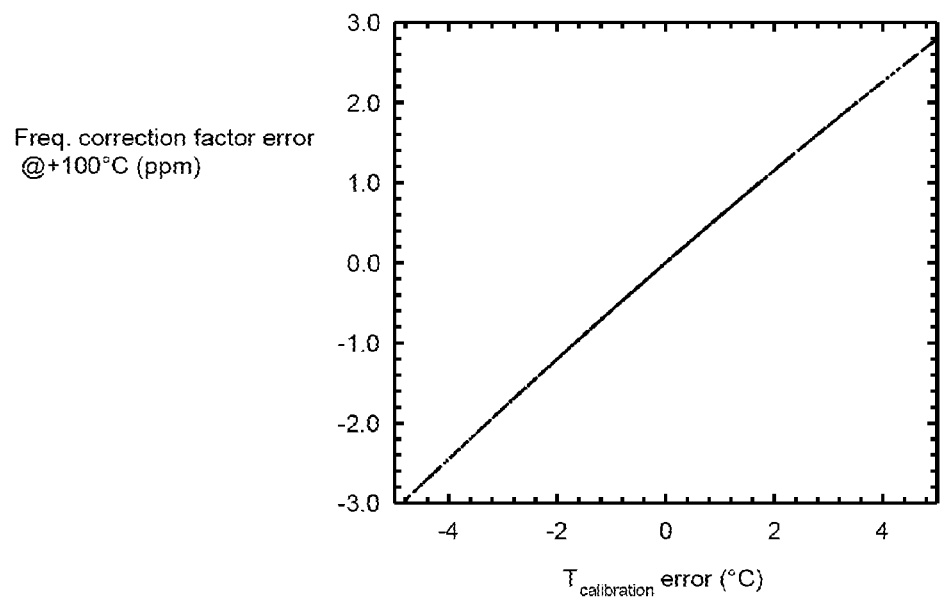
FIG. 9 shows the resulting error in the frequency correction factor (at +100° C. above calibration temperature) based on sample calibration data with a temperature error.

This equation defines a correction ratio, which expresses the change in the spring constant when moving to a new temperature T. The calibration temperature $T_0$ is known. Errors in $T_0$ will result in errors in the correction factor (as shown in FIG. 9 below).

This equation enables the amount by which the spring constant has changed to be determined, which in turn results in a change in frequency By knowing the reference frequency accurately, a frequency conversion circuit (i.e. a local oscillator circuit) can be controlled to generate a desired output frequency. Thus, accurate frequency correction can be carried out by ASIC circuitry.

Frequency ratios can be measured with very high accuracy, limited only by the frequency and integration time, so the correction factor can be obtained with high accuracy using the frequency ratio $k_{<100>}/k_{<110>}$ substituted into Equation 6 and Equation 8.

The value $k_{<100>}/k_{<110>}$ can be measured accurately at both temperatures. To obtain the correction factor, the values of τ are obtained from equation 6. The α values and all other parameters in equation 6 are known. Note that the value of β is not known accurately, hence the value of β is substituted out of equation 6. The value of β can be approximately determined during the calibration phase from the frequency ratio (equation 3).

The approach of the invention requires differing $\tau_c$ values for the two resonators in order to determine the operation temperature (see FIG. 5). If the $\tau_c$ values are the same then the ratio of the frequencies of the resonators will not change with temperature. The temperature coefficient of pure Si<100> and Si<110> are effectively identical (even if the Young's moduli are different). Thus, the oxide film is used in order to induce differing $\tau_c$ values. Different orientations are needed for the same reason. Equation 5 shows that if beta is zero, the $\tau_c$ values will be identical, and also that if there are identical values for E<100> and E<110>, the $\tau_c$ values will be identical.

The frequency correction factor defined in equation 8 has a number of error sources.

The contributions to the error in the frequency correction factor of Equation 8) are summarized in the table below. This gives two possible approaches. One is a single calibration operation (at temperature $T_0$) and the other assumes calibration at two temperatures.

| Error | | Correction factor error (single temperature calibration) | Correction factor error (Dual temperature calibration) |
|---|---|---|---|
| Temperature during calibration | $\sigma_{T0}$~3 K | At least <2 ppm (with correction for $2^{nd}$-order $E_{si}$ effects) | N/A |
| f-measurement during calibration | $\sigma_{f,calib}$~1 ppm | ~$\sigma_{f,calib}$ | ~$(\sqrt{2}) * \sigma_{f,calib}$ |
| f-ratio measurement during calibration | $\sigma_{f/f}$~1 ppm (limited by f and integration time) | ~0.5 ppm (depends upon β) | <0.5 ppm (depends upon β) |
| f-ratio measurement during operation | $\sigma_{f/f}$~1 ppm (limited by f and integration time) | ~0.1 ppm (depends upon β) | <0.1 ppm (depends upon β) |
| Non-local process variations | σ(litho, etch, $t_{ox}$ . . .) | 0 | 0 |
| Local process variations | σ(litho, etch, $t_{ox}$ . . .) | ~1500 ppm | 0 |

Figure 8:
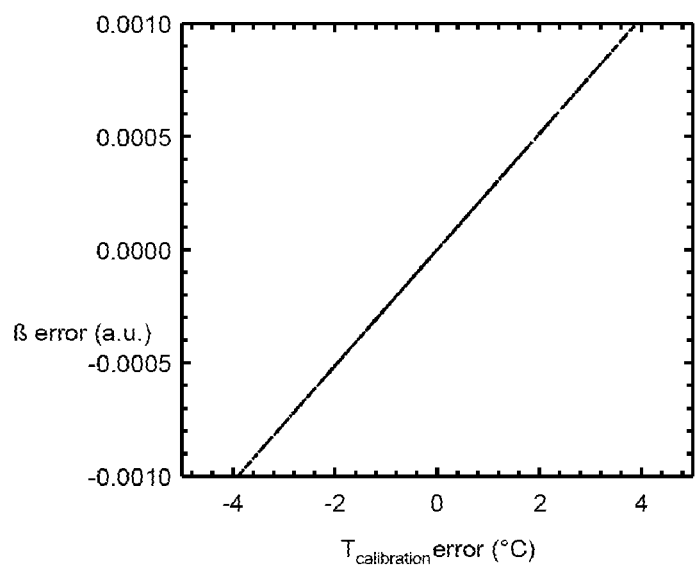
FIG. 8 shows errors in the estimate of the oxide thickness ratio resulting from poor temperature stabilization during calibration.

Errors due to poor temperature stabilization during calibration have been simulated for temperature-independent coefficients $\alpha_{Si}$ and $\alpha_{SiO2}$, and result in an error in β-estimation shown in FIG. 8.

FIG. 8 shows a Monte Carlo simulation of the error in β when β is calculated using sample calibration data with a temperature error. Non-linear temperature dependence of elastic constants is neglected. A 3° C. calibration temperature error results in 0.07% error in β.

This error of ±0.07% for a ±3° C. temperature stabilization compares with a typical process variation in β of 6%. The resulting error in the frequency correction factor at +100° C.

above calibration temperature is less than 2 ppm as shown in FIG. 9, which shows a Monte Carlo simulation of the error in frequency correction factor when this is calculated using sample calibration data with a temperature error.

These Monte Carlo simulations neglect the second order temperature dependence of the Young's modulus (illustrated in FIG. 10 & FIG. 11) but these errors can be eliminated with appropriate correction factors using the known coefficients and the temperature information extracted from the frequency comparison.

Figure 10:
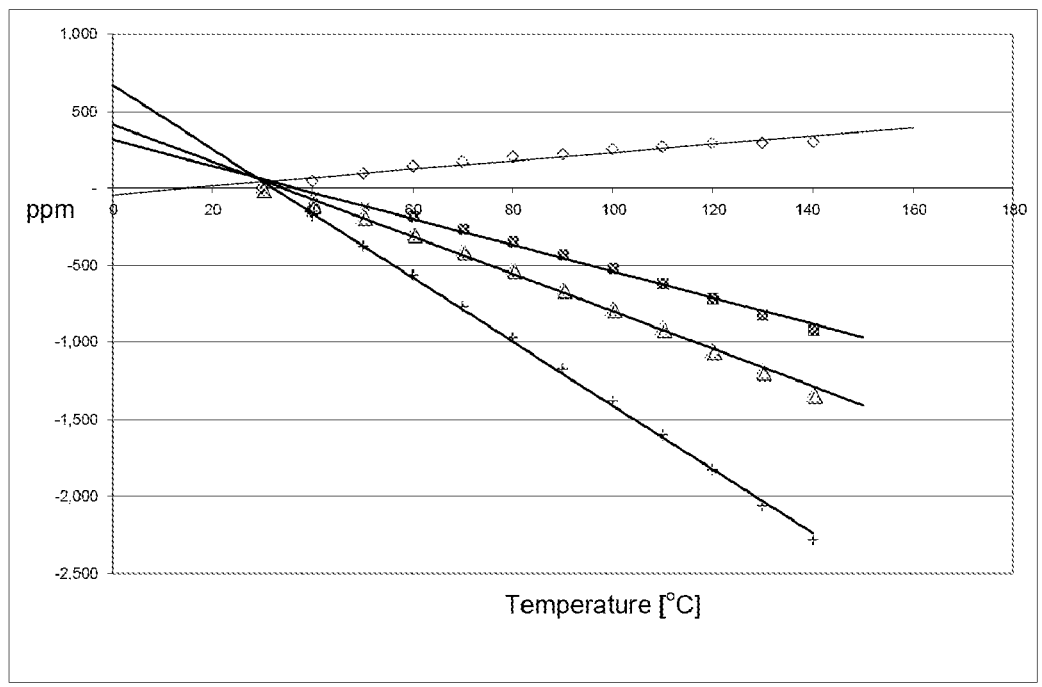
FIG. 10 shows the temperature dependence of the resonant frequency for resonators with different layer thicknesses of silicon dioxide.
Figure 11:
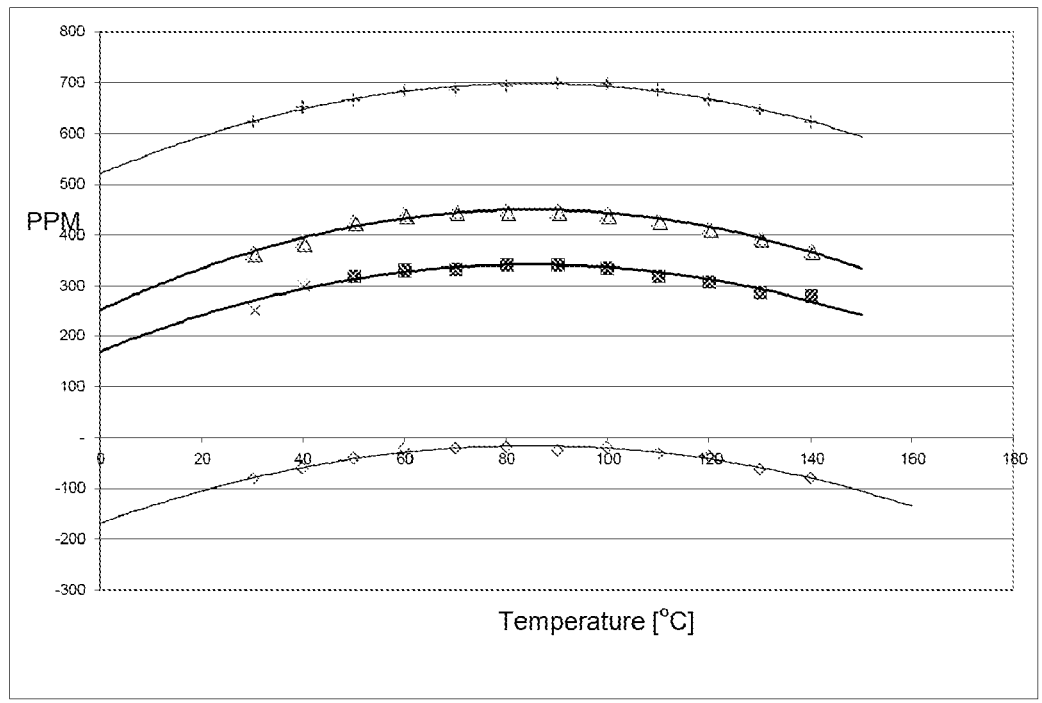
FIG. 11 shows the data from FIG. 10 corrected for first-order temperature effects in order to show the second order effects.

FIG. 10 shows the temperature dependence (in ppm) of the Young's modulus for resonators with for four layer thicknesses of silicon dioxide. FIG. 11 shows the data from FIG. 10 corrected for first-order temperature effects in order to show the second order effects (hence the smaller y-axis scale).

Errors arising from poor absolute frequency calibration obviously feedback directly into the error in the output frequency but do not affect the correction factor unless they result in an error in the frequency ratio. The errors in the correction factor for the <100> and <110> resonators are shown in FIGS. 12 and 13 respectively taking a 1 ppm error in (f<100>/f<110>) during calibration and during operation.

Figure 12:
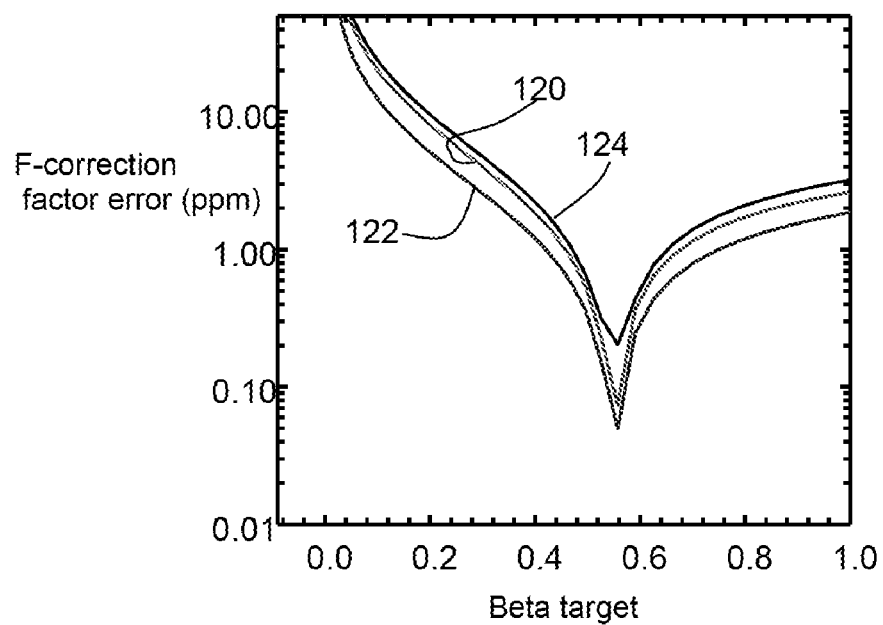
FIG. 12 shows the errors in the correction factor for a first alignment of resonator taking a 1 ppm error in frequency ratio during calibration and during operation.

In FIG. 12 for the <100> resonator, plot 120 shows the frequency correction factor error resulting from the measured frequency ratio error during calibration and plot 122 shows the frequency correction factor error resulting from the measured frequency ratio error during operation. Plot 124 is the combined error.

Figure 13:
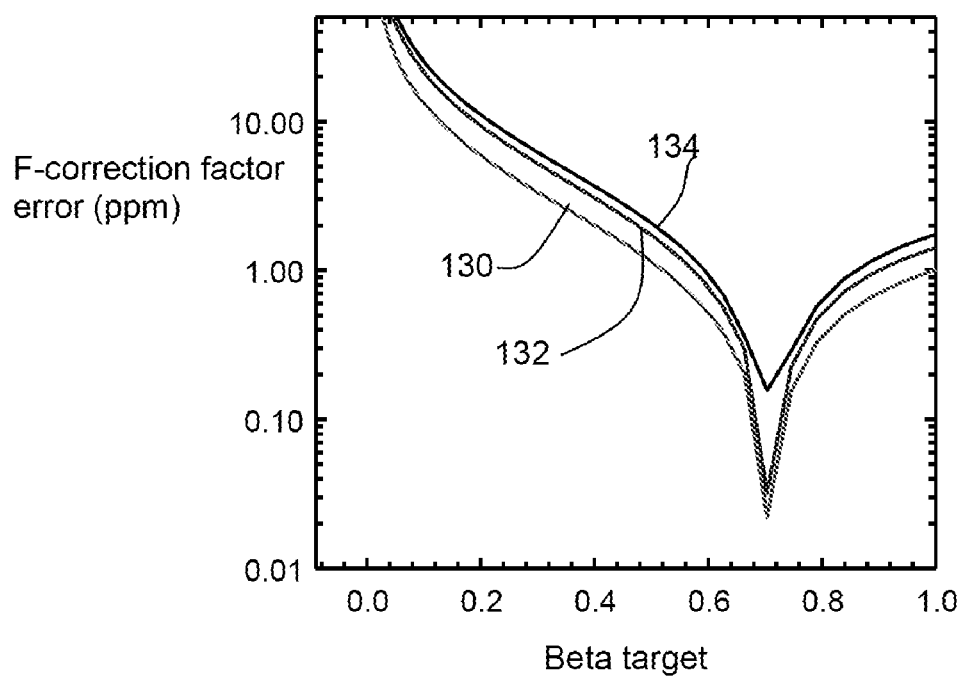
FIG. 13 shows the errors in the correction factor for a second alignment of resonator taking a 1 ppm error in frequency ration during calibration and during operation (+50° C. above calibration temperature).

In FIG. 13 for the <110> resonator, plot 130 shows the frequency correction factor error resulting from the measured frequency ratio error during calibration and plot 132 shows the frequency correction factor error resulting from the measured frequency ratio error during operation. Plot 134 is the combined error. For the perfectly compensated resonators, the resulting error in the correction factor is even less than the error in the frequency ratio.

Again, the error due to non-local process variations is zero. The error due to local process variations is difficult to estimate as there is limited data available on these but the fact that frequency spread for "spread-free" designs still exhibits strong local correlation suggests that this remaining spread is still dominated by non-local effects.

FIGS. 12 and 13 show that the oxide thickness plays a role in optimising the frequency correction factor.

In deriving equation 6 it is assumed that the B value is the same for both resonators. In this case a single calibration temperature can be used to determine beta. If the devices are not well-matched and thus the beta values are not correlated as shown in FIG. 7 then more than one calibration temperature is required in order to determine beta. The desired beta value has an influence on the manufacturing process (the oxide thickness). Which beta value is chosen depends upon which resonator is chosen as the frequency reference (the other resonator is only used to determine the correction factor to apply to the first frequency). If the <100> device is used as the frequency reference then $\beta \sim 0.5$ (between 0.45 and 0.60) is chosen for the two devices (FIG. 12). If the <110> device is used as the frequency reference, then $\beta \sim 0.7$ (between 0.63 and 0.78) is chosen for the two devices (FIG. 13).

As mentioned above, a second approach is possible where the frequency and frequency ratio is calibrated at two or more temperatures. In this case, the two frequency measurements are taken at both temperatures. In the same way as described above, equation 8 can be used to derive the unknown terms. As there is an extra set of values, there is one extra degree of freedom, which means that the equations can be solved for different values of beta between the two resonators.

More than two calibration temperatures can be used to increase accuracy, at the expense of a prolonged calibration process.

The use of (at least) two calibration temperatures has several advantages:

1. Errors due to temperature stabilization in the calibration phase can be greatly reduced (as shown in the table above) as equation 8 can be used to extract the only unknown term in equation 8 ($\tau_{c<110>}/\tau_{c<100>}$) (previously defined using temperature dependent terms in equation 6).

2. Temperature stabilization is no longer required which greatly reduces time (and cost) during the calibration phase.

3. Dual temperature calibration is much less sensitive to any non-local variations or orientation-dependent processes.

The multiple calibration approach thus has advantages even if the devices are well matched (for example identical beta values).

Oxidation rates have been shown to vary with crystal orientation, and this could cause unwanted physical differences between the two resonators. This effect can be minimized when the oxidation rate is limited by the diffusion of oxidizing species, and this is certainly the case for the thick oxides typical for a MEMS resonator process (>200 nm).

If local processes variations, such oxide thickness differences, are found to be an issue, the calibration can be performed at two temperatures as explained above, as this eliminates the sensitivity of the technique to local process variations.

In the description above, the directions <100> and <110> have been used. However, the invention applies to any two orientations of the spring with respect to the crystal structure, providing there is a difference in the resulting resonator property, particularly the Young's moduli.

The invention requires the resonator springs to have two materials. One material (e.g. Si) has a Young's modulus that is orientation dependent. The other material has a different temperature coefficient of Young's modulus from the first. Ideally, the elastic constants of this second material are orientation-independent. The two orientations and different temperature coefficients gives rise to the differing $\tau c$ values for the two resonators, which is used in order to determine the operation temperature (see e.g. FIG. 5). If the $\tau c$ values are the same then the ratio of the frequencies of the resonators will not change with temperature (even if the absolute frequency is changing). The temperature coefficients of pure Si<100> and Si<110> are effectively identical (even if the Young's moduli are different). Thus, the second material (in this example an oxide film) is used in order to induce differing $\tau c$ values.

The conditions above can apply not only to silicon and silicon oxide, but other semiconductor materials may be used and other "second materials" may also be used. The materials used will depend on the options available to the particular processing technology used.

The invention has been demonstrated for dog-bone resonators, partly because of the elongate spring member which is therefore particularly sensitive to crystal alignment. However, other resonator designs can be used having an elongate spring portion, which will make the oscillation response orientation-dependent.

The means for measuring the resonant frequency ratio between the first and second resonators (at the different temperatures) has not been described or shown in the drawings. This is conventional and will be well known to those skilled in the art. In simple terms, the number of cycles is counted in the digital domain and the ratio of these numbers calculated. Thus, a detection circuit is associated with each resonator, and digital circuitry is used for analysing the detected signals to derive a frequency ratio between the resonator signals.

One analytical approach has been shown for how to derive the correction frequency factor. However, other analytical approaches are possible. The invention is based on the recognition the orientation dependence of the Young's modulus of Si and the different temperature coefficient of SiO2 (vs. Si) enable frequency ratios to be used to gather information about the system during operation. In the preferred implementation, the use of two resonators that are identical except for the orientation allows the temperature coefficients to be determined at a single calibration temperature.

By comparing the resonant frequencies at different temperatures, temperature compensation can be carried out, but without requiring actual measurement of temperature. The equations above are used to explain the theory, but they are not essential to the invention. The correction factor can simply be obtained from a look up table, which essentially converts the equations above into a one-to-one mapping from measured frequency ratio at the operating temperature into a resonant frequency.

As is clear from the description above, the preferred implementation requires only one calibration temperature measurement. However, this is not essential, and there are advantages to a multiple temperature calibration process.

The invention enables the frequency error to be reduced significantly, for example it has been demonstrated that the error can be brought down to 1 ppm and below.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A crystalline semiconductor resonator device comprising:
a first resonator having an elongate spring member which includes a first portion of a crystalline semiconductor, for supporting a semiconductor resonator mass of the first resonator;
a second resonator having an elongate spring member which includes a second portion of the crystalline semiconductor for supporting a resonator mass of the second resonator,
wherein the elongate spring members are aligned with respect to a crystal structure of the crystalline semiconductor such that the respective elongate spring members have Young's moduli that are different from one another,
wherein the elongate spring members of the first and second resonators each include a portion of a material having a temperature dependency of the Young's modulus that is different than a temperature dependency of the Young's modulus of the crystalline semiconductor; and
a measurement device for measuring a resonant frequency ratio between the first and second resonators at a calibration temperature and an operation temperature and for deriving therefrom a frequency of one of the resonators at the operation temperature which takes into account the temperature dependency of the one of the resonators.

2. A device as claimed in claim 1, wherein each resonator has a resonator mass portion and an elongate spring portion connected to the resonator mass portion.

3. A device as claimed in claim 1, wherein the first resonator spring member is aligned with the <100> crystal direction and the second resonator spring member is aligned with the <110> crystal direction.

4. A device as claimed in claim 1, wherein the first and second resonators are arranged side by side and formed from the same layers.

5. A device as claimed in claim 1, wherein the portion of material having a temperature dependency of the Young's modulus that is different than the temperature dependency of the Young's modulus of the crystalline semiconductor has a temperature dependency that is opposite the temperature dependency of the crystalline semiconductor.

6. A device as claimed in claim 1, wherein each resonator includes a semiconductor core and an oxide coating.

7. A device as claimed in claim 6, wherein each resonator includes a silicon core and a silicon oxide coating.

8. A device as claimed in claim 7, wherein each resonator has a ratio $\beta$ defined as a silicon oxide to silicon cross-sectional area ratio in the elongate spring member when viewed perpendicular to an axis of the elongate spring member, and wherein the ratio $\beta$ is the same for both resonators.

9. A device as claimed in claim 8, wherein the ratio $\beta$ is selected as a value for which the required temperature correction of the resonant frequency from the calibration temperature to the operation temperature is minimum.

10. A device as claimed in claim 9, wherein the ratio $\beta$ is between one of 0.45 and 0.60, and 0.63 and 0.78.

11. The device of claim 1, wherein the first resonator has a first resonant frequency and the second resonator has a second resonant frequency, the ratio of the respective first and second resonant frequencies being correlated with respective temperature coefficients of the resonant frequencies, thereby facilitating a determination of the temperature dependence of the resonant frequency of each resonator via a single frequency comparison.

12. The device of claim 11, wherein the measurement device is configured and arranged to use the ratio to determine the temperature dependence of the resonant frequency of each resonator via a single comparison of the respective frequencies of the resonators.

13. The device of claim 11, wherein the measurement device is configured and arranged to use the determined temperature dependence of the resonant frequency of each resonator to determine an operational frequency of one of the resonators via a single comparison of the respective frequencies of the resonators during operation.

14. The device of claim 11, wherein the measurement device is configured and arranged to
use the ratio to determine the temperature dependence of the resonant frequency of each resonator via a single comparison of the respective frequencies of the resonators in a calibration mode, and
use the determined temperature dependence of the resonant frequency of each resonator to determine an operational frequency of one of the resonators via a single comparison of the respective frequencies of the resonators in an operation mode.

15. The device of claim 11, wherein the ratio of the respective first and second resonant frequencies is correlated with respective temperature coefficients of the resonant frequencies to facilitate a determination of a resonator frequency based upon a single frequency comparison during operation, thereby providing a temperature-independent frequency reference.

16. The device of claim 11, wherein the measurement device is configured and arranged to
   use the ratio to determine the temperature dependence of the resonant frequency of each resonator via a comparison of the respective frequencies of the resonators in a calibration mode, and
   use the determined temperature dependence of the resonant frequency of each resonator to determine an operational frequency of one of the resonators via a comparison of the respective frequencies of the resonators in an operation mode.

17. A method of operating a crystalline semiconductor resonator, comprising:
   measuring a resonant frequency ratio between first and second resonators at a calibration temperature ($T_0$), each resonator including an elongate spring member having a crystalline semiconductor, the elongate spring members being aligned differently with respect to a crystal structure of the crystalline semiconductor such that each elongate spring member has a Young's modulus that is different than a Young's modulus of the other elongate spring member, and the elongate spring members of the first and second resonators each including a portion of a material having a temperature dependency of the Young's modulus that is different than a temperature dependency of a Young's modulus of the crystalline semiconductor;
   measuring the resonant frequency ratio between first and second resonators at an operation temperature; and
   deriving, from the resonant frequency ratios measured at the calibration temperature and at the operation temperature, a frequency of one of the resonators at the operation temperature which takes into account the temperature dependency of the one of the resonators.

18. A method as claimed in claim 17, further comprising deriving a correction factor which is used to derive the resonant frequency at the operation temperature from the resonant frequency at the calibration temperature.

19. A method as claimed in claim 17, further comprising measuring the resonant frequency ratio for at least two calibration temperatures.

20. The method of claim 17,
   further including using the resonant frequency ratio measured at the calibration temperature to determine the temperature dependence of the resonant frequency of each resonator via a comparison of the respective frequencies of the resonators, and
   wherein deriving a frequency of one of the resonators at the operation temperature includes using the determined temperature dependence of the resonant frequency of each resonator to determine an operational frequency of one of the resonators via a comparison of the respective frequencies of the resonators in an operation mode.

* * * * *